(12) United States Patent
Colt, Jr. et al.

(10) Patent No.: US 9,397,203 B2
(45) Date of Patent: Jul. 19, 2016

(54) LATERAL SILICON-ON-INSULATOR BIPOLAR JUNCTION TRANSISTOR PROCESS AND STRUCTURE

(71) Applicant: GLOBALFOUNDRIES INC., Grand Cayman (KY)

(72) Inventors: John Z. Colt, Jr., Williston, VT (US); John J. Ellis-Monaghan, Grand Isle, VT (US); Leah M. Pastel, Essex Junction, VT (US); Steven M. Shank, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/677,460

(22) Filed: Apr. 2, 2015

(65) Prior Publication Data

US 2015/0214346 A1     Jul. 30, 2015

Related U.S. Application Data

(62) Division of application No. 14/151,935, filed on Jan. 10, 2014, now Pat. No. 9,059,230.

(51) Int. Cl.
*H01L 29/66* (2006.01)
*H01L 29/737* (2006.01)
(Continued)

(52) U.S. Cl.
CPC .......... *H01L 29/737* (2013.01); *H01L 29/0649* (2013.01); *H01L 29/0821* (2013.01);
(Continued)

(58) Field of Classification Search
CPC . H01L 21/02293; H01L 21/36; H01L 29/735; H01L 29/66242; H01L 29/6625

USPC .......................... 257/197, 273, 351, 362, 378
See application file for complete search history.

(56) References Cited

U.S. PATENT DOCUMENTS

| 5,298,786 A | 3/1994 | Shahidi et al. |
| 5,389,561 A | 2/1995 | Gomi |

(Continued)

FOREIGN PATENT DOCUMENTS

| JP | 2002134522 A | 5/2002 |
| JP | 2006080508 A | 3/2006 |
| WO | 2006109221 A2 | 10/2006 |

OTHER PUBLICATIONS

Dekker et al., "An Ultra Low Power Lateral Bipolar Polysilicon Emitter Technology on SOI", Electron Devices Meeting, 1993. IEDM '93. Technical Digest.

(Continued)

*Primary Examiner* — Tan N Tran
(74) *Attorney, Agent, or Firm* — Scully, Scott, Murphy & Presser, P.C.

(57) ABSTRACT

Device structures, fabrication methods, and design structures for a bipolar junction transistor. A first terminal of the bipolar junction transistor is formed from a section of a device layer of a semiconductor-on-insulator wafer. An intrinsic base of the bipolar junction transistor is formed from an epitaxially-grown section of a first semiconductor layer, which is coextensive with a sidewall of the section of the device layer. A second terminal of the bipolar junction transistor is formed from a second semiconductor layer that is coextensive with the epitaxially-grown section of the first semiconductor layer. The epitaxially-grown section of a first semiconductor layer defines a first junction with the section of the device layer, and the second semiconductor layer defines a second junction with the epitaxially-grown section of the first semiconductor layer.

9 Claims, 11 Drawing Sheets

(51) Int. Cl.
    *H01L 29/735* (2006.01)
    *H01L 29/06* (2006.01)
    *H01L 29/10* (2006.01)
    *H01L 29/08* (2006.01)
    *H01L 29/73* (2006.01)

(52) U.S. Cl.
    CPC ........ *H01L29/1008* (2013.01); *H01L 29/6625* (2013.01); *H01L 29/66242* (2013.01); *H01L 29/735* (2013.01); *H01L 29/66265* (2013.01); *H01L 29/7317* (2013.01)

(56) References Cited

U.S. PATENT DOCUMENTS

| | | | |
|---|---|---|---|
| 5,786,258 | A | 7/1998 | Miwa et al. |
| 5,952,706 | A | 9/1999 | Bashir |
| 6,376,897 | B2 | 4/2002 | Yamada et al. |
| 6,897,545 | B2 * | 5/2005 | Menut ............... H01L 29/1012 257/575 |
| 7,397,108 | B2 | 7/2008 | Arnborg |
| 7,808,039 | B2 | 10/2010 | Cai et al. |
| 8,022,506 | B2 | 9/2011 | Ludikhuize |
| 8,288,758 | B2 * | 10/2012 | Ning ................... H01L 29/0808 257/19 |
| 8,324,713 | B2 | 12/2012 | Chen et al. |

OTHER PUBLICATIONS

Shine et al., "A 31 GHz fmax Lateral BJT on SOI Using Self-Aligned External Base Formation Technology", in proceeding of: Electron Devices Meeting, 1998. IEDM '98 Technical Digest.

Sato et al., A 60-GHz fT Super Self-Aligned Selectively Grown SiGe-Base (SSSB) Bipolar Transistor with Trench Isolation Fabricated on SOI Substrate and its Application to 20-Gb/s Optical Transmitter IC's, IEEE Trans. On El. Dev. 46(7) 1332-1338 (1999).

Nii et al., A Novel Lateral Bipolar Transistor with 67 GHz fmax on Thin-Film SOI for RF Analog Applications, Electron Devices, IEEE Transactions on (vol. 47, Issue: 7 ) Jul. 2000.

Sun et al., Lateral High-Speed Bipolar Transistors on SOI for RF SoC Applications, IEEE Transaction on Electron Devices, vol. 52, No. 7, Jul. 2005.

Cai et al., "Complementary Thin-Base Symmetric Lateral Bipolar Transistors on SOI", Electron Devices Meeting (IEDM), 2011 IEEE International Dec. 5-7, 2011.

Kumar et al., "Bipolar Charge-Plasma Transistor: A Novel Three Terminal Device", Electron Devices, IEEE Transactions on (vol. 59, Issue: 4) Apr. 2012.

Parke et al., "A High-Performance Lateral Bipolar Transistor Fabricated on SIMOX" Electron Device Letters, IEEE (vol. 14, Issue: 1) Jan. 1993.

Notice of Allowance issued in U.S. Appl. No. 14/151,935, dated Mar. 4, 2015.

* cited by examiner

LATERAL SILICON-ON-INSULATOR BIPOLAR JUNCTION TRANSISTOR PROCESS AND STRUCTURE

BACKGROUND

The invention relates generally to semiconductor device fabrication and, in particular, to device structures for a bipolar junction transistor, as well as fabrication methods and design structures for a bipolar junction transistor.

Bipolar junction transistors are multi-terminal electronic devices that include three main terminal regions defining an emitter, an intrinsic base, and a collector. Bipolar junction transistors come in two types or polarities, known as PNP and NPN based on the doping types of the three main terminal regions. An NPN bipolar junction transistor includes two regions of n-type semiconductor material constituting the emitter and collector, and a thin region of p-type semiconductor material sandwiched between the two regions of n-type semiconductor material to constitute the intrinsic base. A PNP bipolar junction transistor includes two regions of p-type semiconductor material constituting the emitter and collector, and a thin region of n-type semiconductor material sandwiched between the two regions of p-type semiconductor material to constitute the base. The differing doping types of the emitter, base, and collector define a pair of p-n junctions, namely a collector-base junction and an emitter-base junction, across which the conductivity type changes. In use, a voltage applied across the emitter-base junction controls the movement of charge carriers to produce charge flow between the collector and emitter.

Bipolar junction transistors may be found, among other end uses, in high-frequency and high-power applications. The heterojunction bipolar transistor is a type of bipolar junction transistor that uses differing semiconductor materials for the emitter and base regions, which creates a heterojunction. Heterojunction bipolar transistors may find particular use in radiofrequency integrated circuits, which are used in wireless communications systems, power amplifiers in mobile devices, etc.

Improved device structures, fabrication methods, and design structures are needed for bipolar junction transistors.

SUMMARY

In an embodiment of the invention, a method is provided for fabricating a device structure for a bipolar junction transistor. The method includes patterning a device layer of a semiconductor-on-insulator wafer, epitaxially growing a section of a first semiconductor layer that is coextensive with a sidewall of the device layer, and depositing a second semiconductor layer that is coextensive with the first semiconductor layer. The epitaxially-grown section of a first semiconductor layer defines a first junction with the section of the device layer. The second semiconductor layer defines a second junction with the epitaxially-grown section of the first semiconductor layer. The device layer may comprise a first terminal of the bipolar junction transistor, the first semiconductor layer may define an intrinsic base of the bipolar junction transistor, and the second semiconductor layer may define a second terminal of the bipolar junction transistor.

In an embodiment of the invention, a device structure for a bipolar junction transistor is fabricated using a device layer of a semiconductor-on-insulator wafer. The device structure includes a first terminal comprised of a section of the device layer. The section of the device layer has a sidewall. The device structure further includes an intrinsic base coextensive with the sidewall of the section of the device layer and a second terminal coextensive with the intrinsic base. The intrinsic base is comprised of a first semiconductor layer with a section having an epitaxial relationship with the section of the device layer and defining a first junction with the device layer. The second terminal is comprised of a second semiconductor layer that defines a second junction with the section of the first semiconductor layer.

In another embodiment, a hardware description language (HDL) design structure is encoded on a machine-readable data storage medium. The HDL design structure comprises elements that, when processed in a computer-aided design system, generates a machine-executable representation of a device structure fabricated using a device layer of a semiconductor-on-insulator wafer. The HDL design structure includes a first terminal comprised of a section of the device layer. The section of the device layer has a sidewall. The device structure further includes an intrinsic base coextensive with the sidewall of the section of the device layer and a second terminal coextensive with the intrinsic base. The intrinsic base is comprised of a first semiconductor layer with a section having an epitaxial relationship with the section of the device layer and defining a first junction with the device layer. The second terminal is comprised of a second semiconductor layer that defines a second junction with the section of the first semiconductor layer. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
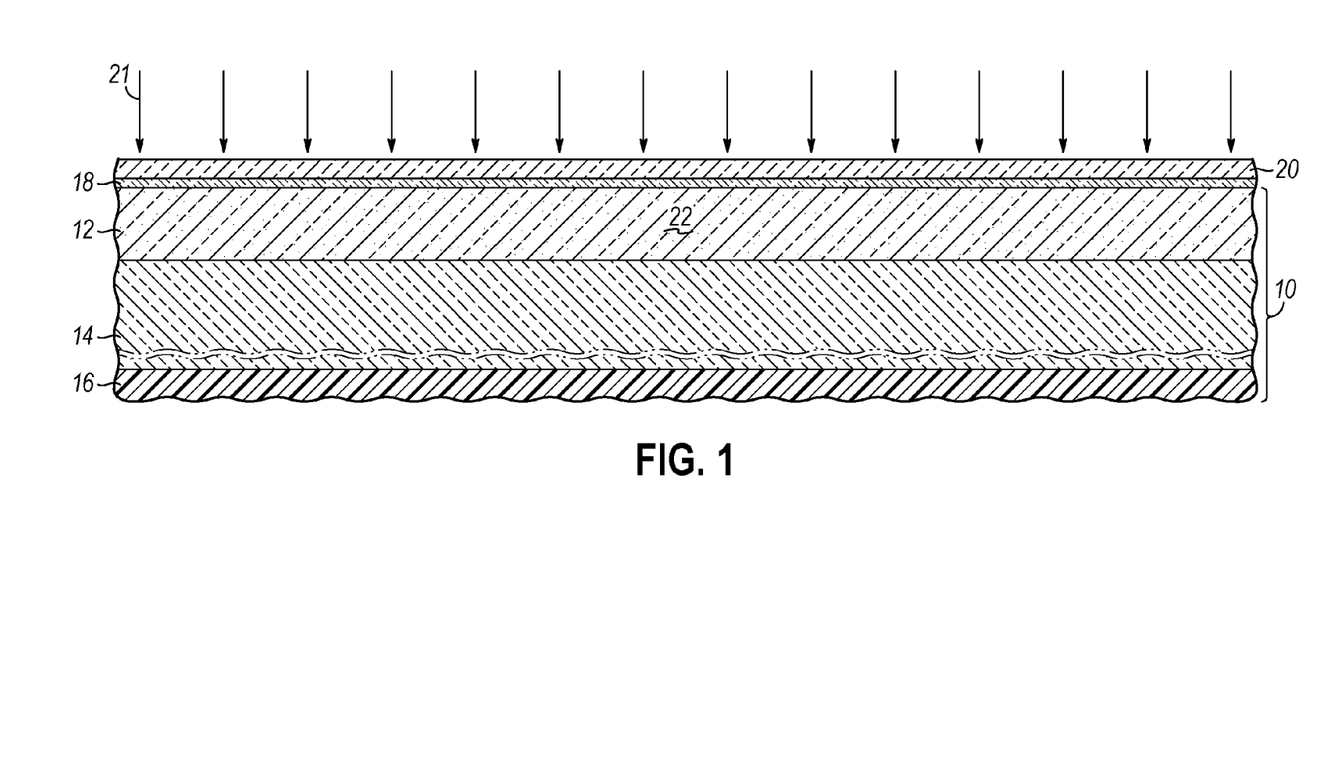
FIGS. 1-10 are cross-sectional views of a portion of a substrate at successive stages of a processing method for fabricating a device structure in accordance with an embodiment of the invention.

With reference to FIG. 1 and in accordance with an embodiment of the invention, a bipolar junction transistor may be formed using a silicon-on-insulator (SOI) wafer 10 that includes a device layer 12, a buried insulator layer 14, and a handle substrate 16. The device layer 12 is supported on a top surface of the buried insulator layer 14 and is electrically insulated from the handle substrate 16 by the buried insulator layer 14. The device layer 12 is comprised of a single crystal semiconductor material, such as silicon or another material that is primarily composed of silicon. In one embodiment, the device layer 12 is silicon. The buried insulator layer 14 may be comprised of an electrical insulator and, in particular, may constitute a buried oxide layer that is comprised of silicon dioxide (e.g., $SiO_2$). The buried insulator layer 14 electrically isolates the handle substrate 16 from the device layer 12, which is considerably thinner than the handle substrate 16.

The handle substrate 16 may also be comprised of a single crystal semiconductor material, such as silicon, or a different material.

Dielectric layers 18, 20 are serially formed on the device layer 12. The dielectric layers 18, 20 may be comprised of different electrical insulators or dielectric materials. In one embodiment, dielectric layer 18 may be comprised of silicon dioxide ($SiO_2$) and dielectric layer 20 may be comprised of silicon nitride ($Si_3N_4$) with dielectric layer 18 having a smaller thickness than dielectric layer 20. The materials contained in the dielectric layers 18, 20 may be formed by wet or dry thermal oxidation, chemical vapor deposition (CVD), or a combination of these processes, and are selected to etch selectively to the semiconductor material constituting the device layer 12.

The device layer 12 may be doped to reduce its electrical resistivity by introducing an electrically-active dopant, such as a dopant from Group V of the Periodic Table (e.g., phosphorus (P), arsenic (As), or antimony (Sb)) effective to impart n-type conductivity in the host semiconductor material. In one embodiment, the n-type dopant may be introduced into the device layer 22 by the implantation of ions 21 comprising the n-type dopant. The ions 21 are implanted into the device layer 12 using implantation conditions (e.g., kinetic energy and dose) selected such that the ions 21 stop within the device layer 12 and provide a targeted level of electrical conductivity when activated. The device layer 12 may be annealed to electrically activate the dopant and to alleviate implantation damage. The device layer 12 is later used to form a collector of the device structure.

Figure 2:
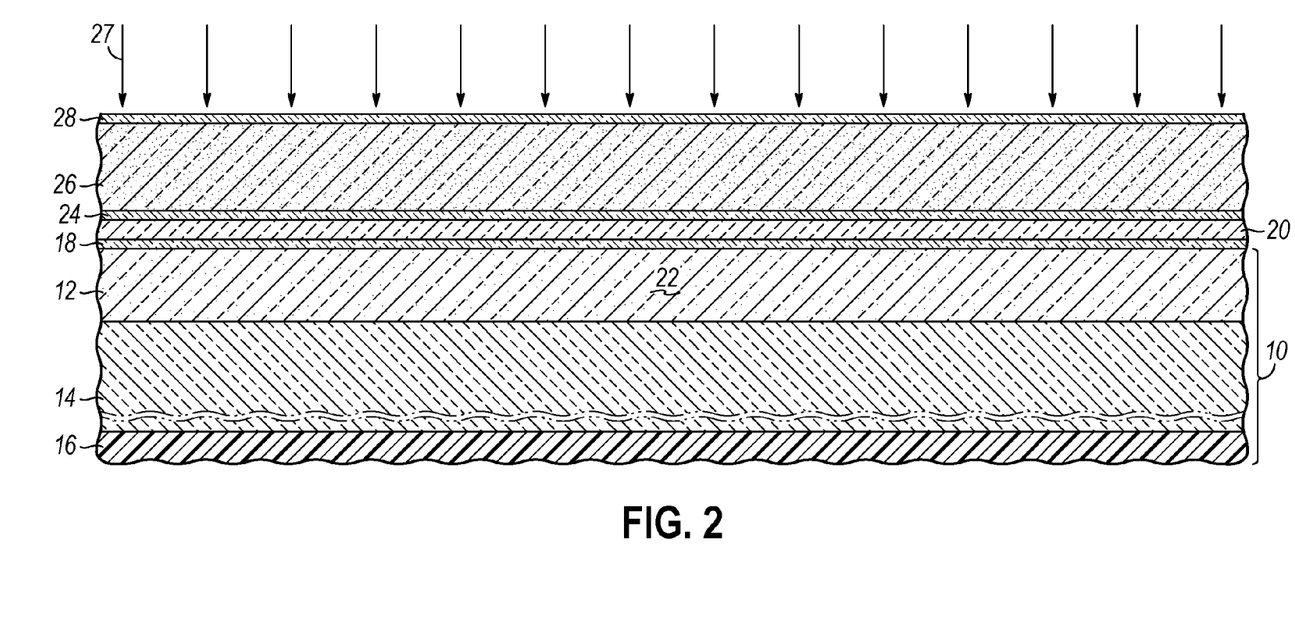

With reference to FIG. 2 in which like reference numerals refer to like features in FIG. 1 and at a subsequent fabrication stage, a dielectric layer 24 comprised of an electrical insulator is formed on the dielectric layer 20. A semiconductor layer 26 comprised of a semiconductor material is deposited on the dielectric layer 24. A dielectric layer 28 is then formed to cover the semiconductor layer 26. The semiconductor material in layer 26 may be comprised of polycrystalline semiconductor material. In particular, the semiconductor material constituting the semiconductor layer 26 may be comprised of polycrystalline silicon (polysilicon) deposited using rapid thermal chemical vapor deposition (RTCVD) and silane ($SiH_4$) as a source gas. The dielectric layers 24, 28 may be comprised of an electrical insulator, such as silicon dioxide ($SiO_2$), that is either deposited with CVD or formed by wet or dry thermal oxidation.

An electrically-active dopant, such as a dopant from Group III of the Periodic Table (e.g., boron (B)) effective to impart p-type conductivity in the host semiconductor material, may be introduced into the semiconductor layer 26 to reduce its electrical resistivity. In one embodiment, the semiconductor layer 26 is p-type silicon. In one embodiment, the semiconductor layer 26 may be ion implanted with ions 27 comprising the p-type dopant. The ions 27 are implanted into the semiconductor layer 26 using implantation conditions (e.g., kinetic energy and dose) selected such that the ions 21 stop within the semiconductor layer 26 and, when activated, provide a targeted level of electrical conductivity. The semiconductor layer 26 is thereafter annealed to electrically activate the dopant and to alleviate implantation damage.

Figure 3:
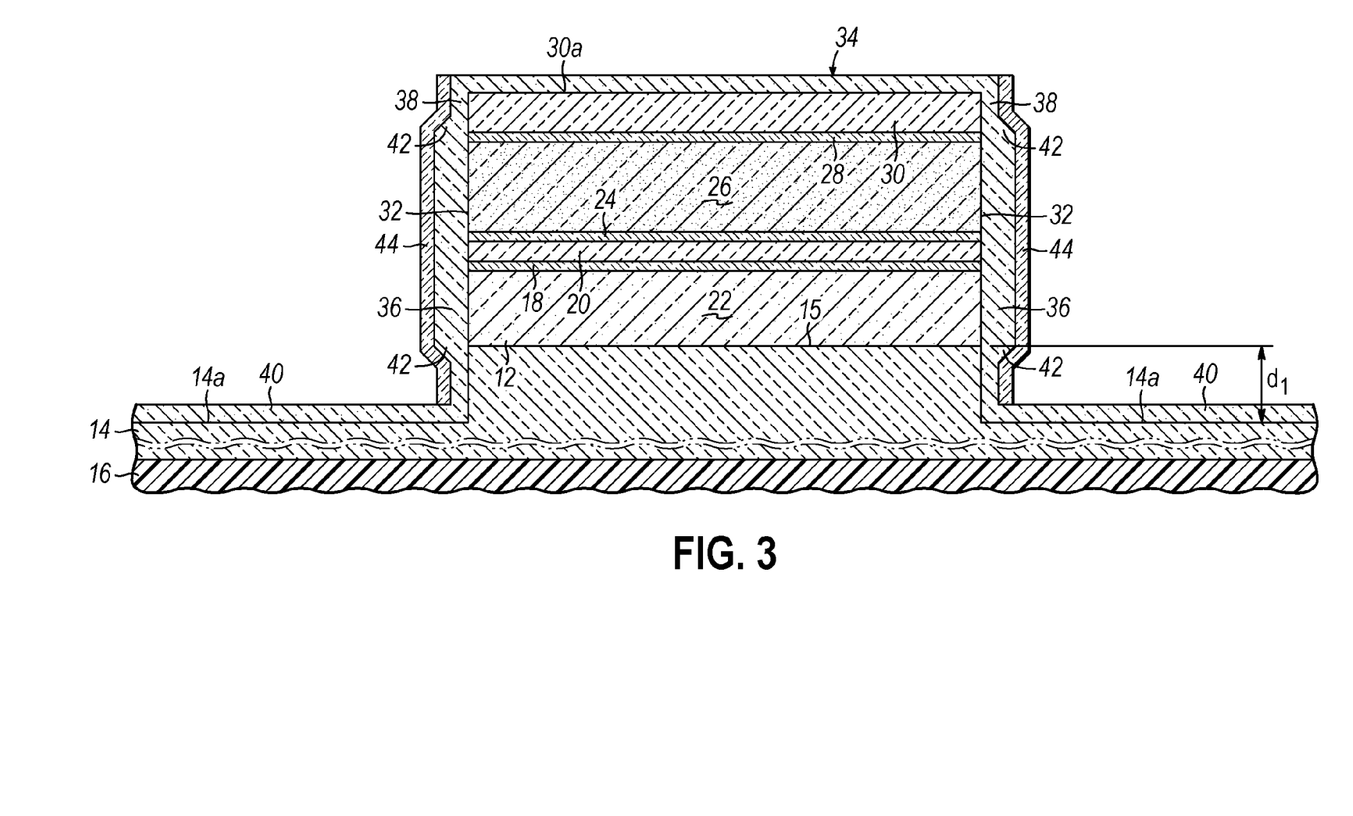

With reference to FIG. 3 in which like reference numerals refer to like features in FIG. 2 and at a subsequent fabrication stage, a dielectric layer 30 is applied on the dielectric layer 28. The dielectric layer 30 may be comprised of an electrical insulator such as silicon nitride ($Si_3N_4$) deposited by CVD. The dielectric layer 30 may be patterned using photolithography and etching processes to provide an etch mask at the intended location of the bipolar junction transistor.

An etching process is then used to pattern a layer stack having outer sidewalls 32 aligned with the edges of the patterned dielectric layer 30, which functions as an etch mask during the etching process. The etching process, which may be a wet chemical etch or a dry etch, may rely on one or more etch chemistries that remove the constituent materials of the various layers in the layer stack. The layer stack patterned by the etching process includes sections of the dielectric layers 24, 28, the semiconductor layer 26, the dielectric layers 18, 20, 24, and the device layer 12. In particular, the sidewalls 32 of the layer stack define a lateral boundary for a section of the device layer 12 and, eventually, a collector of the device structure formed from the section of the device layer 12 bounded by the sidewalls 32.

The etching process etches to a shallow depth, $d_1$, into the buried insulator layer 14 such that the top surface 14a of the buried insulator layer 14 is recessed relative to an interface 15 between the device layer 12 and the buried insulator layer 14 within the etched layer stack. The interface 15 represents the original location for the top surface 14a of the buried insulator layer 14 in the SOI wafer 10.

An intrinsic base layer 34, which is comprised of a material suitable for forming an intrinsic base of a bipolar junction transistor, is formed as a continuous additive layer. The intrinsic base layer 34 forms on the recessed top surface 14a of the buried insulator layer 14, the sidewalls 32 of the etched layer stack, and the top surface 30a of the dielectric layer 30 atop the etched layer stack. The intrinsic base layer 34 includes an epitaxially-grown section 36, as well as field sections 38 and 40 that adjoin the epitaxially-grown section 36.

The intrinsic base layer 34 may be comprised of a semiconductor material, such as silicon, silicon-germanium (SiGe) including silicon (Si) and germanium (Ge) in a composition with the silicon content ranging from 95 atomic percent to 50 atomic percent and the germanium content ranging from 5 atomic percent to 50 atomic percent, or SiGe:C with a composition having up to 10 percent carbon, and may be doped with one or more impurity species, such as boron. If comprised of SiGe, the germanium content of the intrinsic base layer 34 may be uniform or the germanium content of the intrinsic base layer 34 may be graded and/or stepped across the thickness of intrinsic base layer 34. If the germanium content is stepped, a thickness of the intrinsic base layer 34, such as a thickness directly contacting the dielectric layer 28, may not contain any germanium and may be entirely comprised of silicon (Si). In an embodiment, the intrinsic base layer 34 may be p-type SiGe doped with boron and characterized by a stepped Ge profile.

The intrinsic base layer 34 includes an epitaxially-grown section 36 that is positioned in lateral alignment with the device layer 12 and the semiconductor layer 26 The field sections 38 and 40, which are disposed on the exposed dielectric material, are comprised of non-single crystal semiconductor material that adjoin the epitaxially-grown section 36. The epitaxially-grown section 36 of intrinsic base layer 34 has a portion that is coextensive with the single-crystal semiconductor material of the device layer 12 and a portion that is coextensive with the semiconductor layer 26.

The intrinsic base layer 34 may be formed using a low temperature epitaxial (LTE) growth process, such as ultra-high-vacuum (UHV) chemical vapor deposition (CVD). Single crystal semiconductor material (e.g., single crystal silicon and/or single crystal SiGe) epitaxially grows in the portion of the epitaxially-grown section 36 of the intrinsic base layer 34 that is laterally aligned and in contact with the device layer 12 along the sidewalls 32. The single crystal semiconductor material of the device layer 12 serves as a seed crystal for the lateral heteroepitaxial or homoepitaxial growth of this portion of the epitaxially-grown section 36 of intrinsic base layer 34. The crystal structure of the device layer 12 establishes a pattern for the crystal structure of the semiconductor material in this portion of the epitaxially-grown section 36 laterally grown on the device layer 12 along the sidewalls 32. This portion of the epitaxially-grown section 36 of intrinsic base layer 34 has the same lattice structure and crystalline orientation as the device layer 12 taking into account any differences in lattice constant from dissimilar compositions of the constituent semiconductor materials. The growth direction for the epitaxially-grown section 36 is set by the crystal direction of the device layer 12 that is normal to the sidewall 32 of the device layer 12 and that is lateral relative to the sidewall 32.

The portion of the epitaxially-grown section 36 of intrinsic base layer 34 that is coextensive with the semiconductor layer 26 along the sidewalls 32 may have a slight different thickness than the portion coextensive with the device layer. For example, if the semiconductor layer 26 is comprised of polycrystalline semiconductor material, the growth rate of this portion may depend upon the orientation of the grains of the polycrystalline semiconductor material.

The field sections 38, 40 of the intrinsic base layer 34 deposit on and are coextensive with the recessed top surface 14a of the buried insulator layer 14, the sidewalls 32 of the etched layer stack above and below the device layer 12 and the semiconductor layer 26, and the top surface 30a of the dielectric layer 30 in the etched layer stack. The field sections 38, 40, which are not epitaxially grown during formation of the intrinsic base layer 34, may comprise polycrystalline semiconductor material as the contacting dielectric materials are unable to function as a growth template for epitaxy. The field sections 38, 40 may be thinner than the epitaxially-grown section 36. The intrinsic base layer 34 further includes facets 42 that provide transitions from the thicker epitaxially-grown section 36 to the thinner field sections 38, 40. The facets 42 of the intrinsic base layer 34 may comprise a mixture of polycrystalline and single crystal semiconductor material.

Dielectric spacers 44 are formed on the intrinsic base layer 34 at the sidewalls 32 of the layer stack. The dielectric spacers 44 may be formed by depositing a conformal layer comprised of an electrical insulator, such as a layer of silicon dioxide ($SiO_2$) formed by wet or dry thermal oxidation, CVD, or a combination of these processes, and shaping the conformal layer with an etching process, such as a reactive ion etch (RIE), that preferentially removes the electrical insulator from horizontal surfaces.

Figure 4:
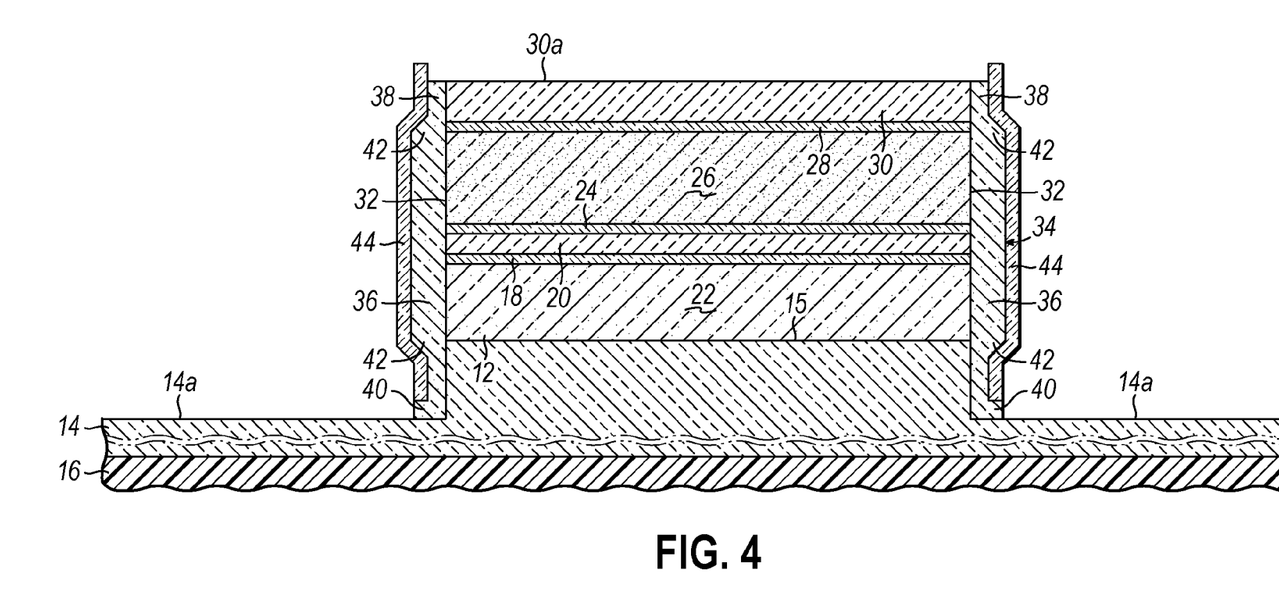

With reference to FIG. 4 in which like reference numerals refer to like features in FIG. 3 and at a subsequent fabrication stage, an etching process is performed to remove the intrinsic base layer 34 from the recessed top surface 14a of the buried insulator layer 14 and the top surface 30a of the dielectric layer 30 in the etched layer stack. The etching process, which may be a wet chemical etch or a dry etch, may rely on one or more etch chemistries that remove the constituent material of the intrinsic base layer 34 selective to the materials of the buried insulator layer 14, the dielectric layer 30, and the dielectric spacers 44. The removal of these portions of the field sections 38, 40 of the intrinsic base layer 34 may be effective to reduce parasitic capacitance in the final device structure for the bipolar junction transistor.

The dielectric spacers 44 protect the epitaxially-grown section 36 and the adjacent portions of the field sections 38, 40 of the intrinsic base layer 34 disposed along the sidewalls 32 of the layer stack during the performance of the etching process. The preserved field section 38 of the intrinsic base layer 34 extends above the epitaxially-grown section 36 of intrinsic base layer 34 and ends at or near the top surface of the dielectric layer 30. The preserved field section 40 of the intrinsic base layer 34 extends below the section of the device layer 12 and from the epitaxially-grown section 36 of intrinsic base layer 34 toward the recessed top surface 14a of the buried insulator layer 14.

Figure 5:
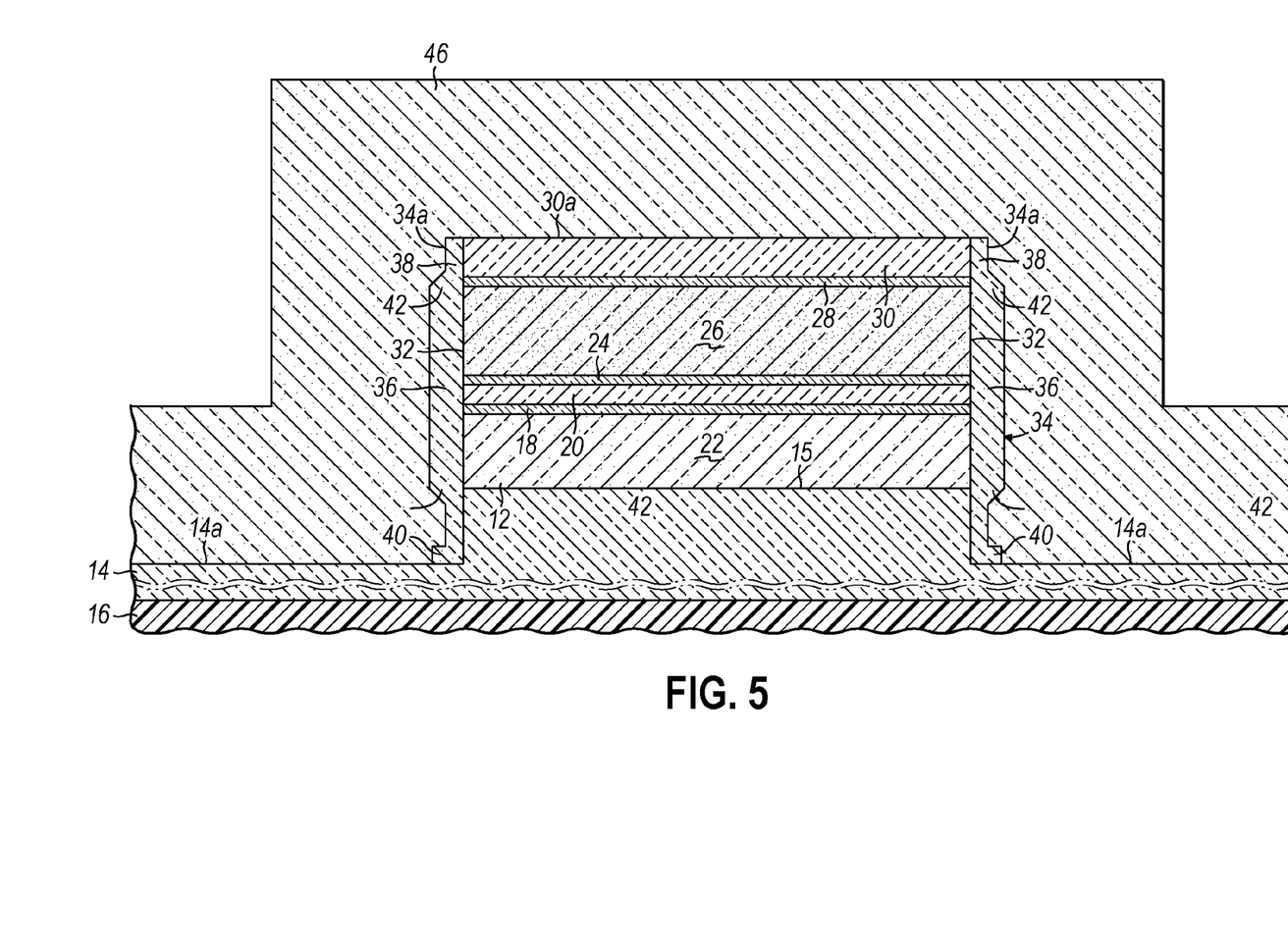

With reference to FIG. 5 in which like reference numerals refer to like features in FIG. 4 and at a subsequent fabrication stage, the dielectric spacers 44 are removed from the sidewalls 32 of the layer stack so that the intrinsic base layer 34 is exposed along the sidewalls 32. The freshly-exposed surface 34a of the intrinsic base layer 34 may be cleaned. If the dielectric spacers 44 are comprised of an oxide of silicon, the wet chemical etching process may utilize a wet chemical etchant comprising buffered hydrofluoric acid (BHF) or diluted hydrofluoric acid (DHF).

A semiconductor layer 46 may be formed on the recessed top surface 14a of the buried insulator layer 14, the intrinsic base layer 34 on the sidewalls 32 of the etched layer stack, and the top surface 30a of the dielectric layer 30 in the etched layer stack. The semiconductor layer 46 encapsulates the laterally-grown intrinsic base layer 34 at the sidewalls 32 of the etched layer stack.

The semiconductor layer 46 may be comprised of a layer of a heavily-doped semiconductor material (e.g., silicon) deposited by CVD, and may be polycrystalline, single crystal due to epitaxial growth initiated at the epitaxially-grown section 36, or a combination thereof. For example, the semiconductor layer 46 may be comprised entirely of polysilicon. As another example, the semiconductor layer 46 may be comprised of single crystal silicon adjacent to the epitaxially-grown section 36 and polysilicon elsewhere. The growth direction for the epitaxially-grown section of the semiconductor layer 46 is set by the crystal direction of the epitaxially-grown section 36 that is normal to its exterior surface and that is lateral relative to the sidewall 32 of the device layer 12. The semiconductor layer 46 may be heavily doped with a concentration of a dopant, such as an n-type dopant effective to impart n-type conductivity. The heavy-doping level reduces the electrical resistivity of the silicon, and may be introduced during epitaxial growth by in situ doping that adds a dopant gas, such as phosphine or arsine, to the CVD reactant gases. In an alternative embodiment, the semiconductor layer 46 may be grown using a selective epitaxial growth (SEG) process that only deposits layer 46 on intrinsic base layer 34 and not on electrical insulator surfaces.

Figure 6:
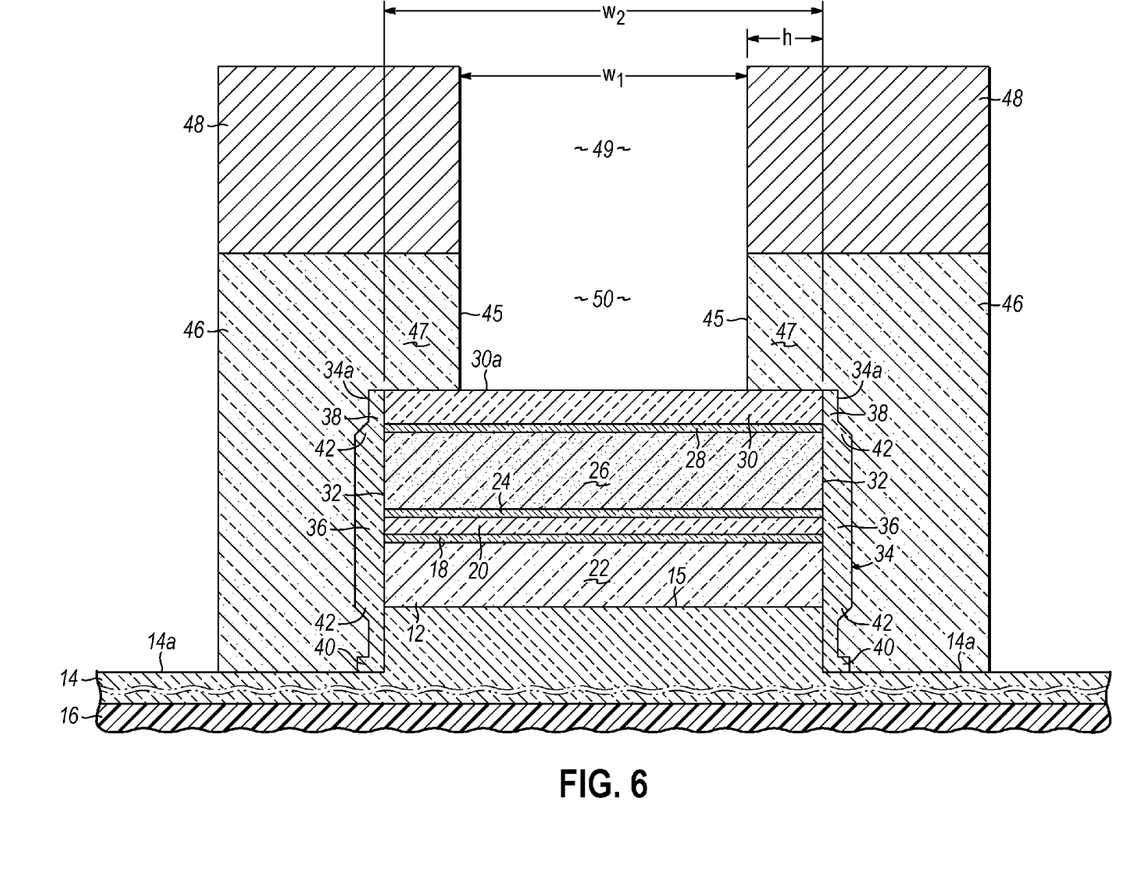

With reference to FIG. 6 in which like reference numerals refer to like features in FIG. 5 and at a subsequent fabrication stage, a patterned mask 48 is formed with an opening 49 that has dimensions (length and width) smaller than the dimensions of the dielectric layer 30 atop the layer stack. For example, the width, $w_1$, of the opening 49 is less than the width, $w_2$, of the dielectric layer 30. The mask 48 may be comprised of a layer of sacrificial material that is applied and patterned with photolithography. To that end, the layer may be comprised of a photoresist that is applied by a spin coating process, pre-baked, exposed to a radiation projected through a photomask, baked after exposure, and developed with a chemical developer to form the opening 49 in the patterned mask 48.

The semiconductor layer 46 is etched with either a wet or dry etching process to remove the constituent semiconductor material selective to the dielectric material of the dielectric layer 30. In one embodiment, RIE may be used to form an opening 50 in the semiconductor layer 46 that penetrates through the semiconductor layer 46 and extends to the top surface 30a of the dielectric layer 30. The opening 50 is aligned with opening 49 and acquires the dimensions (length and width) of the opening 49 in the patterned mask 48. Because the opening 49 in the mask 48 is smaller in size than the top surface 30a (FIG. 5), a section 47 of the semiconductor layer 46 is protected on the top surface 30a by the mask 48 proximate to the edges of the opening 50 and remains after the conclusion of the etching process. Unprotected sections of the semiconductor layer 46 are removed from the recessed top surface 14a of the buried insulator layer 14.

The section 47 of the semiconductor layer 46 overhangs the dielectric layer 30 by a distance, h, such that an inner sidewall 45 of the section 47 is spaced inwardly from the intrinsic base layer 34. The extent of the overhang is determined by the difference in size between the opening 50 and the top surface 30a. The extent of the overhang is given by a distance, h, which is equal to the difference between the width, $w_2$, of the dielectric layer 30 and the width, $w_1$, of the opening 50. The overhang functions to prevent shorting of the base to the emitter when a silicide layer is formed by a subsequent fabrication stage.

Figure 7:
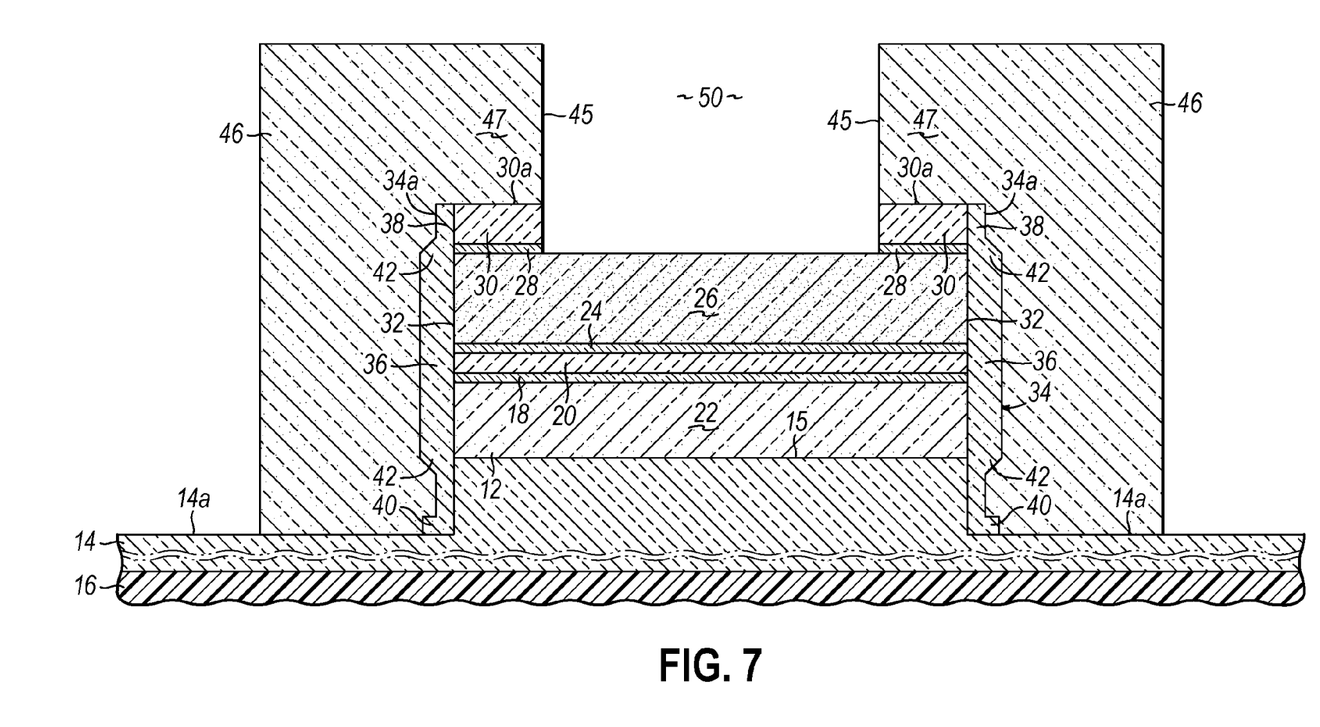

With reference to FIG. 7 in which like reference numerals refer to like features in FIG. 6 and at a subsequent fabrication stage, the mask 48 (FIG. 6) is removed. If comprised of a photoresist, the mask 48 may be removed by ashing or solvent stripping, followed by surface cleaning. RIE may be used to extend the opening 50 to penetrate through the dielectric layer 30 and the dielectric layer 28 to the semiconductor layer 26. In an alternative embodiment, the opening 50 may be extended to penetrate through the dielectric layer 30 and dielectric layer 28 to the semiconductor layer 26 before the mask 48 is removed.

Figure 8:
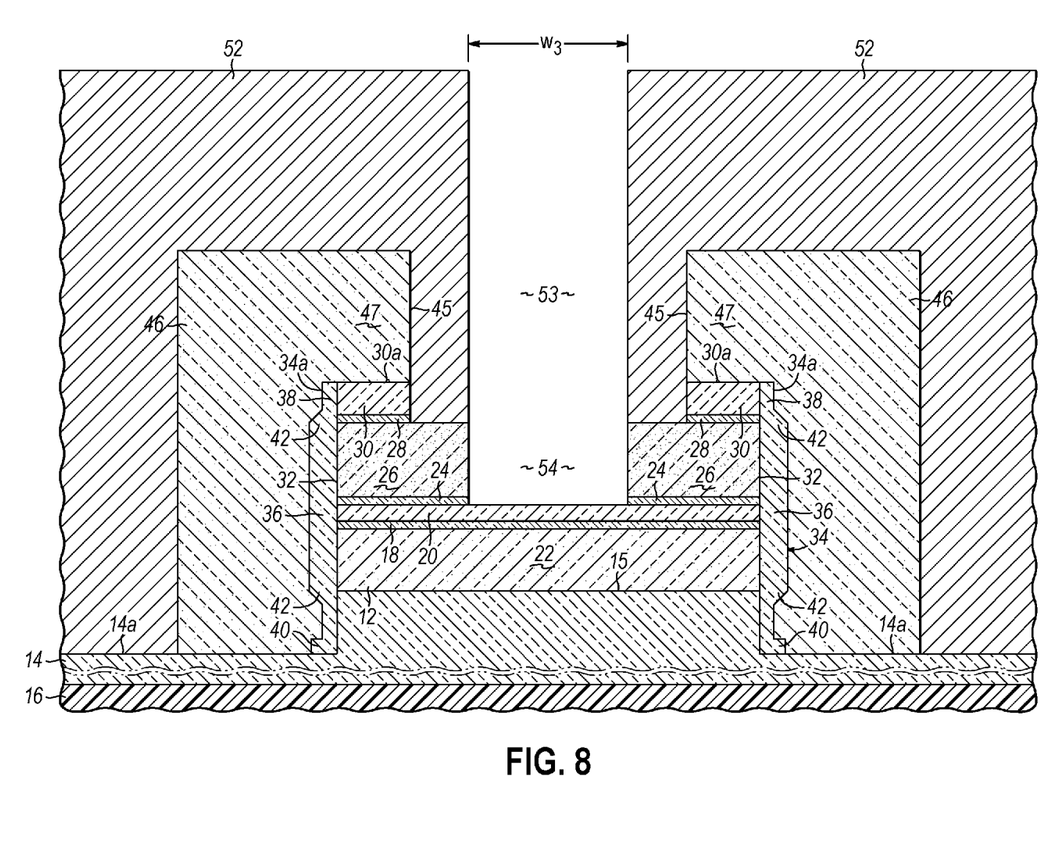

With reference to FIG. 8 in which like reference numerals refer to like features in FIG. 7 and at a subsequent fabrication stage, a patterned mask 52 is formed with an opening 53 that has dimensions (length and width) smaller than the dimensions of the opening 50 penetrating through the semiconductor layer 46. For example, the width, $w_3$, of the opening 53 is less than the width, $w_1$, of the opening 50. The opening 53 is aligned with the opening 50 and may be axially aligned with the opening 50. The mask 52 may be comprised of a layer of sacrificial material that is applied and patterned with photolithography. To that end, the layer may be comprised of a photoresist that is applied by a spin coating process, pre-baked, exposed to a radiation projected through a photomask, baked after exposure, and developed with a chemical developer to form the opening 53 in the patterned mask 52.

With the patterned mask 52 in place, the semiconductor layer 26 and the dielectric layer 24 are etched with either a wet or dry etching process to form an opening 54 penetrating through the semiconductor layer 26 and the dielectric layer 24, and in registration with the opening 53 in the patterned mask 52. In one embodiment, RIE may be used to remove the semiconductor material of the semiconductor layer 26 selective to the electrical insulator of the dielectric layer 24 and the electrical insulator of the dielectric layer 24 selective to the electrical insulator of the dielectric layer 24. The opening 54, which acquires dimensions (length and width) of the opening 53 in the patterned mask 52, is smaller in size than opening 50.

Figure 9:
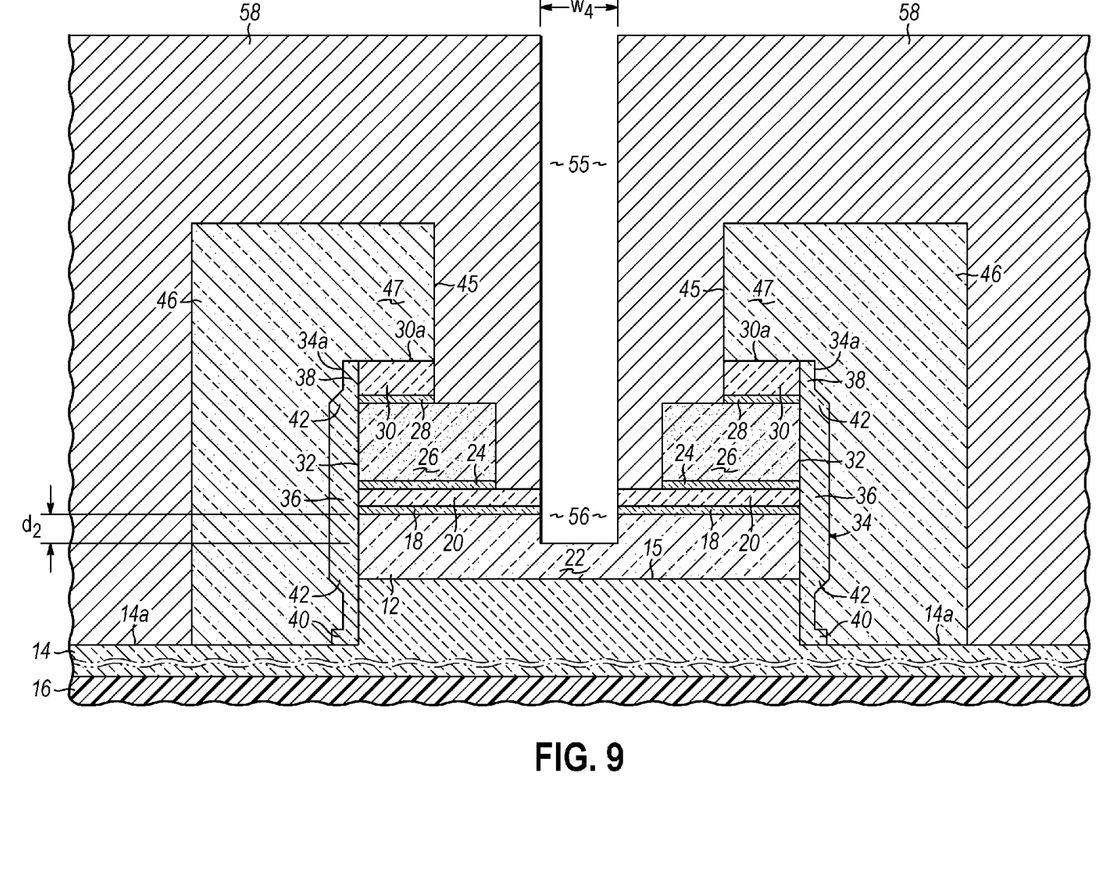

With reference to FIG. 9 in which like reference numerals refer to like features in FIG. 8 and at a subsequent fabrication stage, the mask 52 (FIG. 8) is removed. If comprised of a photoresist, the mask 52 may be removed by ashing or solvent stripping, followed by surface cleaning.

A patterned mask 58 is formed with an opening 55 that has dimensions (length and width) smaller than the dimensions of the opening 50 penetrating through the semiconductor layer 46 and smaller than the dimensions of the opening 54 penetrating through the semiconductor layer 26. For example, the width, $w_4$, of the opening 55 is less than the width, $w_1$, of the opening 50 and is less than the width, $w_3$, of the opening 54. The opening 55 is aligned with the openings 50, 54 and may be axially aligned with one or both of the openings 50, 54. The mask 58 may be comprised of a layer of sacrificial material that is applied and patterned with photolithography. To that end, the layer may be comprised of a photoresist that is applied by a spin coating process, pre-baked, exposed to a radiation projected through a photomask, baked after exposure, and developed with a chemical developer to form the opening 55 in the patterned mask 58.

With the patterned mask 58 in place, the dielectric layers 18, 20 are etched with either a wet or dry etching process to form an opening 56 penetrating through the dielectric layers 18, 20 and in registration with the opening 55 in the patterned mask 58. In one embodiment, RIE may be used to remove the constituent electrical insulators of the dielectric layers 18, 20 selective to the semiconductor material of the device layer 12 to form the opening 56 in the dielectric layers 18, 20. In the representative embodiment, the opening 56 may be extended partially through the device layer 12 to a depth, $d_2$, with an overetch. The opening 56, which acquires dimensions (length and width) of the opening 55 in the patterned mask 58, is smaller in size than either opening 50 or opening 54. The depth of penetration of the opening 56 into the device layer 12 may be less than or equal half of the layer thickness of the device layer 12. The openings 50, 54, 56, which may be aligned or axially aligned, define a tiered or stepped profile collectively defining a central opening in the device structure.

Figure 10:
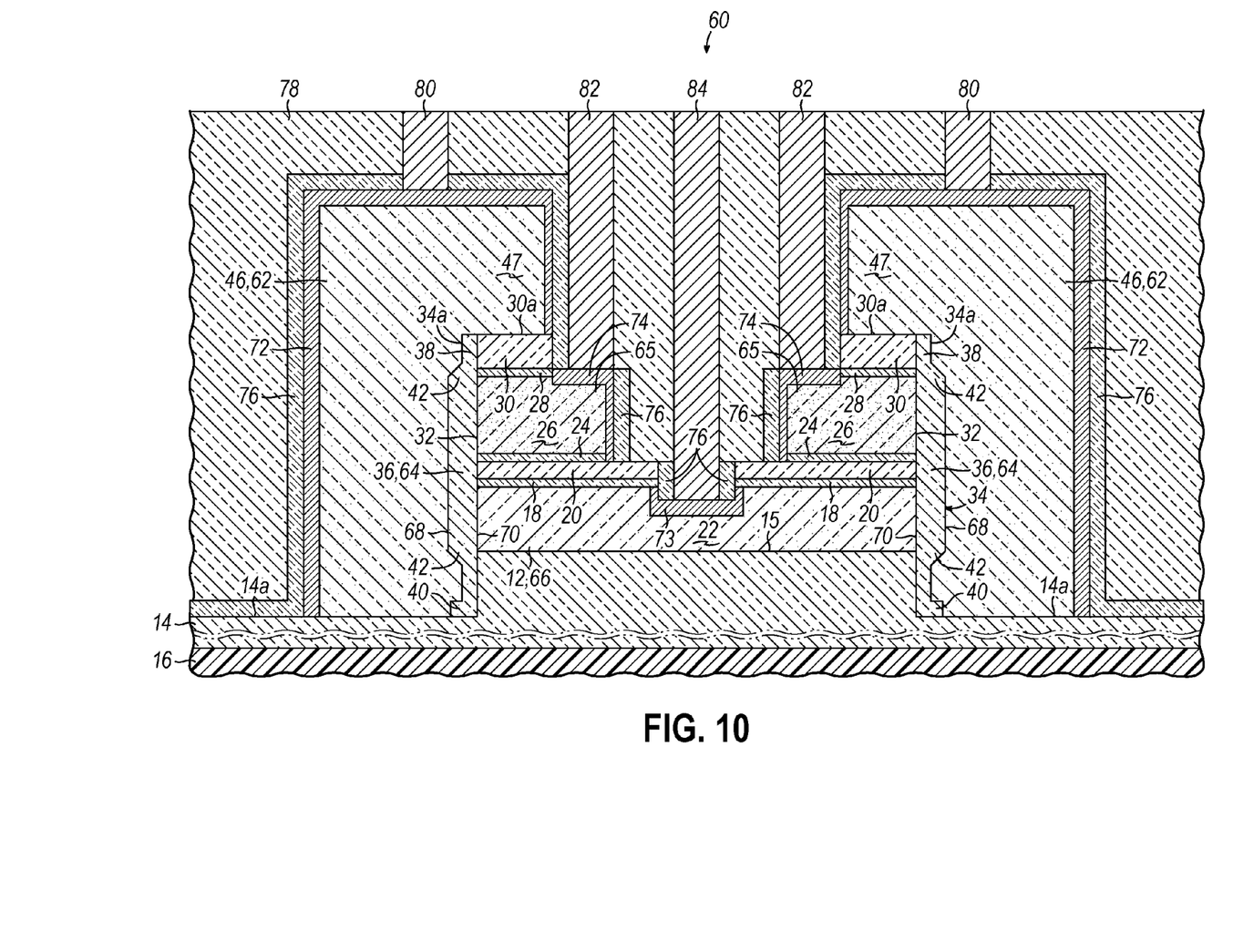

With reference to FIG. 10 in which like reference numerals refer to like features in FIG. 9 and at a subsequent fabrication stage, the mask 58 (FIG. 9) is removed. If comprised of a photoresist, the mask 58 may be removed by ashing or solvent stripping, followed by surface cleaning.

The device structure of the bipolar junction transistor 60 includes a terminal in the form of an emitter 62 defined by the semiconductor layer 46, a terminal in the form of a collector 66 defined by the section of the device layer 12, and an intrinsic base 64 defined by the epitaxially-grown section 36 of the intrinsic base layer 34. The semiconductor layer 26 functions as an extrinsic base 65 that is coupled with the intrinsic base 64. An emitter-base junction 68 is defined or formed at the interface between the contacting n-type and p-type semiconductor materials of the emitter 62 and the intrinsic base 64, and a collector-base junction 70 is defined or formed at the interface between the contacting n-type and p-type semiconductor materials of the intrinsic base 64 and the collector 66. The emitter 62, intrinsic base 64, and collector 66 have a lateral juxtaposed arrangement on the buried insulator layer 14 with the intrinsic base 64 between the emitter 62 and the collector 66, the collector 66 is centrally located in the device structure, and the emitter 62 is located at the periphery or outside of the device structure. The junctions 68, 70 are oriented vertically relative to the top surface of the device layer 12.

In an alternative embodiment, the terminals of the bipolar junction transistor 60 may be exchanged such that the device layer 12 comprises the emitter 62 and the semiconductor layer 46 comprises the collector 66. The collector of the alternative embodiment is located at the periphery or outside of the device structure, and the emitter is centrally located in the device structure.

The bipolar junction transistor 60 may be characterized as a heterojunction bipolar transistor if at least two of the emitter 62, intrinsic base 64, and collector 66 are comprised of semiconductor materials with different bandgaps. For example, the intrinsic base 64 formed from intrinsic base layer 34 may be composed of SiGe and the collector 66 formed from the device layer 12 may be composed of Si without added Ge. As another example, the intrinsic base 64 formed from intrinsic base layer 34 may be composed of SiGe and the emitter 62 formed from the semiconductor layer 46 may be composed of Si without added Ge. In this embodiment, the junctions 68, 70 may be characterized as heterojunctions because the n-type and p-type regions of the bipolar junction transistor 60 are composed of different semiconductors.

During the front-end-of-line (FEOL) portion of the fabrication process, the device structure of the bipolar junction transistor 60 is replicated across at least a portion of the surface area of each die on the SOI wafer 10. A protective layer may be applied to regions of the SOI wafer 10 being used to form the bipolar junction transistors 60 following fabrication. Protective layers may be removed from other regions of the SOI wafer 10 and those regions used to form complementary metal-oxide-semiconductor (CMOS) field-effect transistors. The order in which the field-effect transistors and bipolar junction transistors are formed may be reversed. As a result, both bipolar junction transistors and CMOS transistors may be available on the same SOI wafer 10.

Standard middle-end-of-line (MEOL) and back-end-of-line (BEOL) processing follows, which includes silicide formation, formation of contacts and wiring for the local interconnect structure to the bipolar junction transistor 60, and formation of dielectric layers, via plugs, and wiring for an interconnect structure coupled by the local interconnect wiring with the bipolar junction transistor 60. Other active and passive circuit elements, such as diodes, resistors, capacitors, varactors, and inductors, may be integrated into the interconnect structure and available for use in the integrated circuit.

A section 72 of a silicide layer is formed on an exterior surface of the semiconductor layer 46 comprising the emitter 62. A section 73 of the silicide layer is formed on the exterior surfaces of the section of the device layer 12 comprising the collector 66 and, more specifically, on exterior surfaces of the device layer 12 that are coextensive with the opening 56. A section 74 of the silicide layer is formed on the portion of the semiconductor layer 26 exposed inside opening 54 and, more specifically, on exterior surfaces of the semiconductor layer 26 that are coextensive with the opening 54. Section 74 of the silicide layer is isolated from section 72 of the silicide layer by the residual portion of dielectric layer 30 upon which silicide does not form. Section 74 of the silicide layer is isolated from section 73 of the silicide layer by the residual portions of dielectric layers 18, 20 upon which silicide does not form.

The sections 72-74 of the silicide layer may be formed by a silicidation process that involves one or more annealing steps to form a silicide phase by reacting a layer of silicide-forming metal and the semiconductor material contacting the silicide-forming metal. The layer of a silicide-forming metal is deposited by, for example, CVD or physical vapor deposition (PVD). Candidate refractory metals for the silicide-forming metal include, but are not limited to, titanium (Ti), cobalt (Co), or nickel (Ni). A capping layer comprised of a metal nitride, such as sputter-deposited titanium nitride (TiN), may be applied to cap the silicide-forming metal.

An initial annealing step of the silicidation process may form a metal-rich silicide by consuming the silicide-forming metal and then form silicides of lower metal content that grow by consuming the metal-rich silicides. For example, the initial annealing step may be conducted by heating the silicide-forming metal utilizing rapid thermal annealing (RTA) at an annealing temperature, which may be contingent on the type of refractory metal, of about 400° C. to about 900° C. Silicide does not form on surfaces that are covered by the dielectric layers 18, 20, the dielectric layer 28, and the dielectric layer 30, which promotes self-alignment of the silicide layer and the sectioning into sections 72-74.

Following the initial annealing step, any non-converted silicide-forming metal and the optional capping layer may be removed with, for example, one or more wet chemical etches. The sections 72-74 of silicide may then be subjected to an additional annealing step to form a lower-resistance silicide phase. The annealing temperature of the additional annealing step may be greater than the annealing temperature of the initial annealing step.

A conformal barrier layer 76 of, for example, silicon nitride is formed on the bipolar junction transistor 60. A dielectric layer 78 is applied and planarized, followed by the formation of one or more contacts 80 to the emitter 62, one or more contacts 82 to the extrinsic base 65, and one or more contacts 84 to the collector 66. The contacts 80, 82, 84 are comprised of a conductor, such as a refractory metal like tungsten (W), which can be clad with a conductive liner (e.g., a bilayer of titanium and titanium nitride (Ti/TiN)), and the dielectric layer 78 may be comprised of an electrically-insulating dielectric material, such as borophosphosilicate glass (BPSG).

The bipolar junction transistor 60 may be characterized by reduced parasitic capacitances and reduced series resistances. The bipolar junction transistor 60 lacks a subcollector, which eliminates a source of resistance. The bipolar junction transistor 60 also lacks trench isolation, which eliminates a source of parasitic capacitance. The bipolar junction transistor 60 further lacks a complicated alignment scheme that, in conventional devices, is used to reduce parasitic capacitances.

The bipolar junction transistor 60 is produced with a reduced number of masks in comparison with conventional production schemes and, overall, is produced with a comparatively small mask count. The bipolar junction transistor 60 may exhibit improved performance and integrates well with CMOS processes. The process flow fabricating the bipolar junction transistor 60 has a relatively low complexity. The bipolar junction transistor 60 features a low channel-bulk junction capacitance $C_{bc}$ due at least in part to the absence of a parasitic base-to-collector junction. The emitter 62, intrinsic base 64, and collector 66 of the bipolar junction transistor 60 may each exhibit a low resistance. The bipolar junction transistor 60 can be fabricated late in the process after the source/drain anneals of CMOS devices, and with a low thermal budget in terms of the total amount of thermal energy transferred to the wafer during production.

Figure 11:
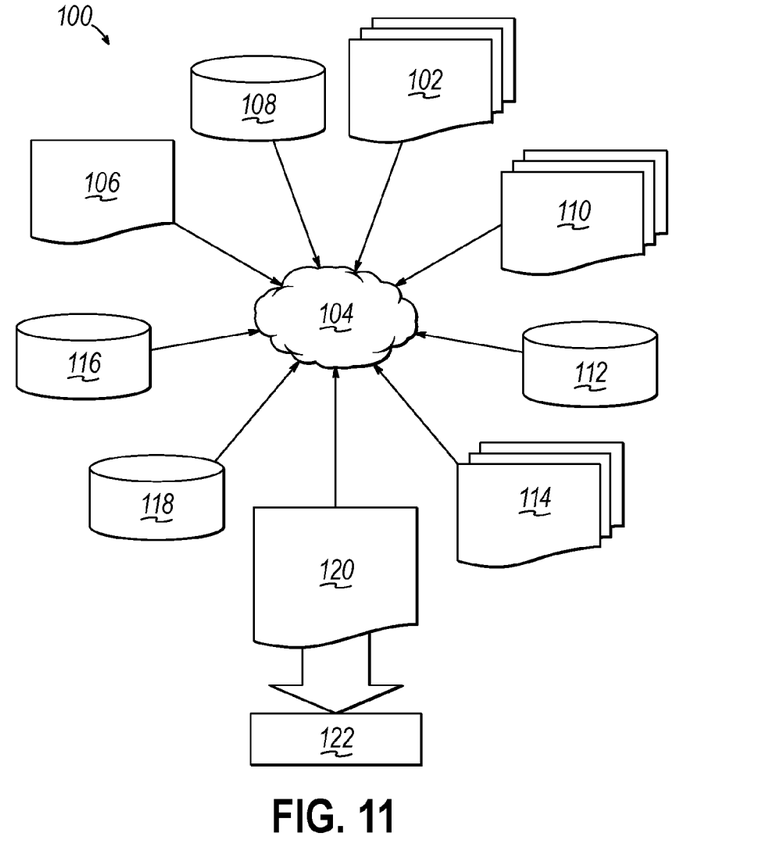
FIG. 11 is a flow diagram of a design process used in semiconductor design, manufacture, and/or test.

FIG. 11 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-10. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 1-10. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 1-10 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-10. In one embodiment, design structure 120 may comprise a compiled, executable HDL simulation model that functionally simulates the devices shown in FIGS. 1-10.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-10. Design structure 120 may then proceed to a stage 122 where, for example, design structure 120: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure for a bipolar junction transistor fabricated using a device layer of a semiconductor-on-insulator wafer, the device structure comprising:
   a first terminal comprised of a section of the device layer, the section of the device layer having a sidewall;
   an intrinsic base coextensive with the sidewall of the section of the device layer, the intrinsic base comprised of a first section of a first semiconductor layer having an epitaxial relationship with the section of the device layer and defining a first junction with the section of the device layer;
   a second terminal coextensive with the intrinsic base, the second terminal comprised of a second semiconductor layer defining a second junction with the first section of the first semiconductor layer;
   a first dielectric layer on a top surface of the device layer; and
   an extrinsic base comprised of a third semiconductor layer on the first dielectric layer, the extrinsic base isolated from the device layer by the first dielectric layer, and wherein the first semiconductor layer has a second section that is integral with the first section and the second section extends across the first dielectric layer to couple the first section of the first semiconductor layer with the third semiconductor layer.

2. The device structure of claim 1 wherein the second semiconductor layer includes a single crystal section that has an epitaxial relationship with the first section of the first semiconductor layer.

3. The device structure of claim 1 wherein the semiconductor-on-insulator wafer includes a buried insulator layer, and a portion of the first semiconductor layer extends below the section of the device layer toward a recessed top surface of the buried insulator layer.

4. The device structure of claim 1 wherein the first terminal is a collector and the second terminal is an emitter.

5. The device structure of claim 1 wherein the first terminal is an emitter and the second terminal is a collector.

6. The device structure of claim 1 further comprising:
   a second dielectric layer on a top surface of the third semiconductor layer;
   a first opening in the second dielectric layer that extends to the third semiconductor layer; and
   a first contact inside the first opening, the first contact coupled by the extrinsic base with the intrinsic base.

7. The device structure of claim 6 further comprising:
   a second opening in the third semiconductor layer and the first dielectric layer, the second opening aligned with the first opening and extending to the device layer; and
   a second contact inside the second opening, the second contact coupled with the first terminal,
   wherein the second opening is smaller than the first opening.

8. The device structure of claim 1 wherein the first semiconductor layer is comprised of a first semiconductor material, and the device layer or the second semiconductor layer is comprised of a second semiconductor material with a bandgap that differs from the first semiconductor material.

9. The device structure of claim 1 wherein the first junction and the second junction are vertically aligned relative to a top surface of the device layer.

* * * * *